(12) United States Patent　　(10) Patent No.: US 7,564,717 B2
Sato et al.　　(45) Date of Patent: Jul. 21, 2009

(54) SEMICONDUCTOR MEMORY DEVICE

(75) Inventors: Kazuhiko Sato, Yokohama (JP);
　　　　　　　Hidetoshi Saito, Yamato (JP); Kiyotaka Uchigane, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 11/923,200

(22) Filed: Oct. 24, 2007

(65) Prior Publication Data

US 2008/0291740 A1　　Nov. 27, 2008

(30) Foreign Application Priority Data

Oct. 30, 2006　(JP) ............................. 2006-294932

(51) Int. Cl.
　　*G11C 11/34* (2006.01)
(52) U.S. Cl. .................. 365/185.23; 365/226
(58) Field of Classification Search ............ 365/185.23, 365/226
See application file for complete search history.

(56) References Cited

U.S. PATENT DOCUMENTS

| | | | |
|---|---|---|---|
| 5,978,268 A | 11/1999 | Zink et al. | |
| 6,421,295 B1 * | 7/2002 | Mao et al. | 365/230.06 |
| 6,573,780 B2 | 6/2003 | Lin et al. | |
| 7,123,079 B2 | 10/2006 | Do | |
| 2003/0071602 A1 * | 4/2003 | Ando | 323/282 |
| 2007/0200612 A1 * | 8/2007 | Jung | 327/407 |
| 2007/0230246 A1 * | 10/2007 | Umezawa et al. | 365/185.09 |

FOREIGN PATENT DOCUMENTS

JP　　2000-331489　　11/2000

* cited by examiner

*Primary Examiner*—Michael T Tran
(74) *Attorney, Agent, or Firm*—Oblon, Spivak, McClelland, Maier & Neustadt, P.C.

(57) ABSTRACT

A semiconductor memory device includes a memory cell array, word lines each of which connects the control gates of the memory cells on the same row together in the memory cell array, a row decoder which selects a word line, and applies a voltage to the selected word line, and a voltage generator which generates a boosted voltage, and outputs the boosted voltage as the voltage, the voltage generator includes a comparator which compares a first voltage with a second voltage, and outputs a comparison result signal, a constant current circuit which generates a first control signal in accordance with the comparison result signal, a first delay circuit which generates a second control signal by delaying the comparison result signal, and a charge pump circuit which generates the boosted voltage in response to the first and second control signals.

20 Claims, 12 Drawing Sheets

Memory cell array

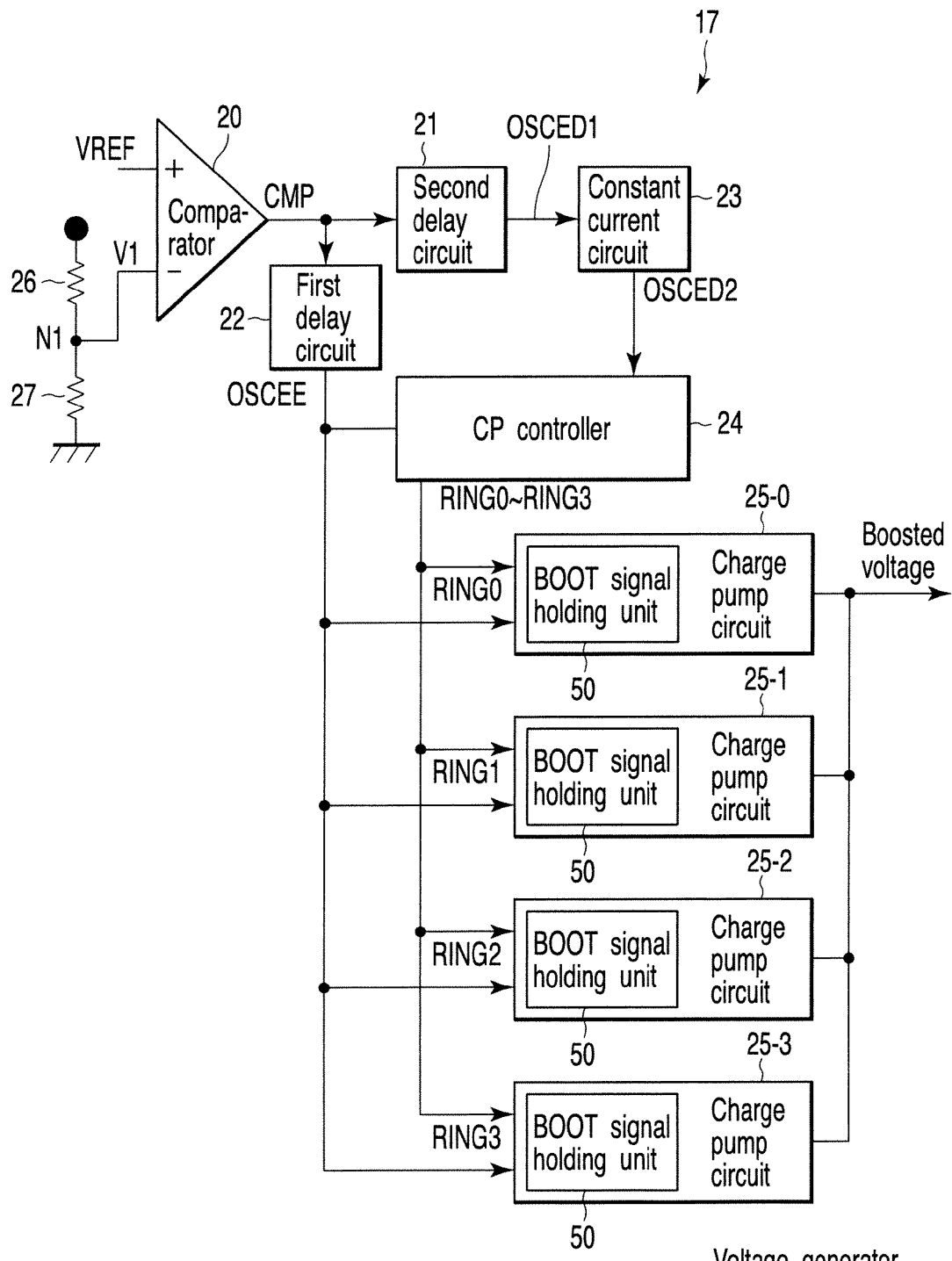
F I G. 7

This embodiment

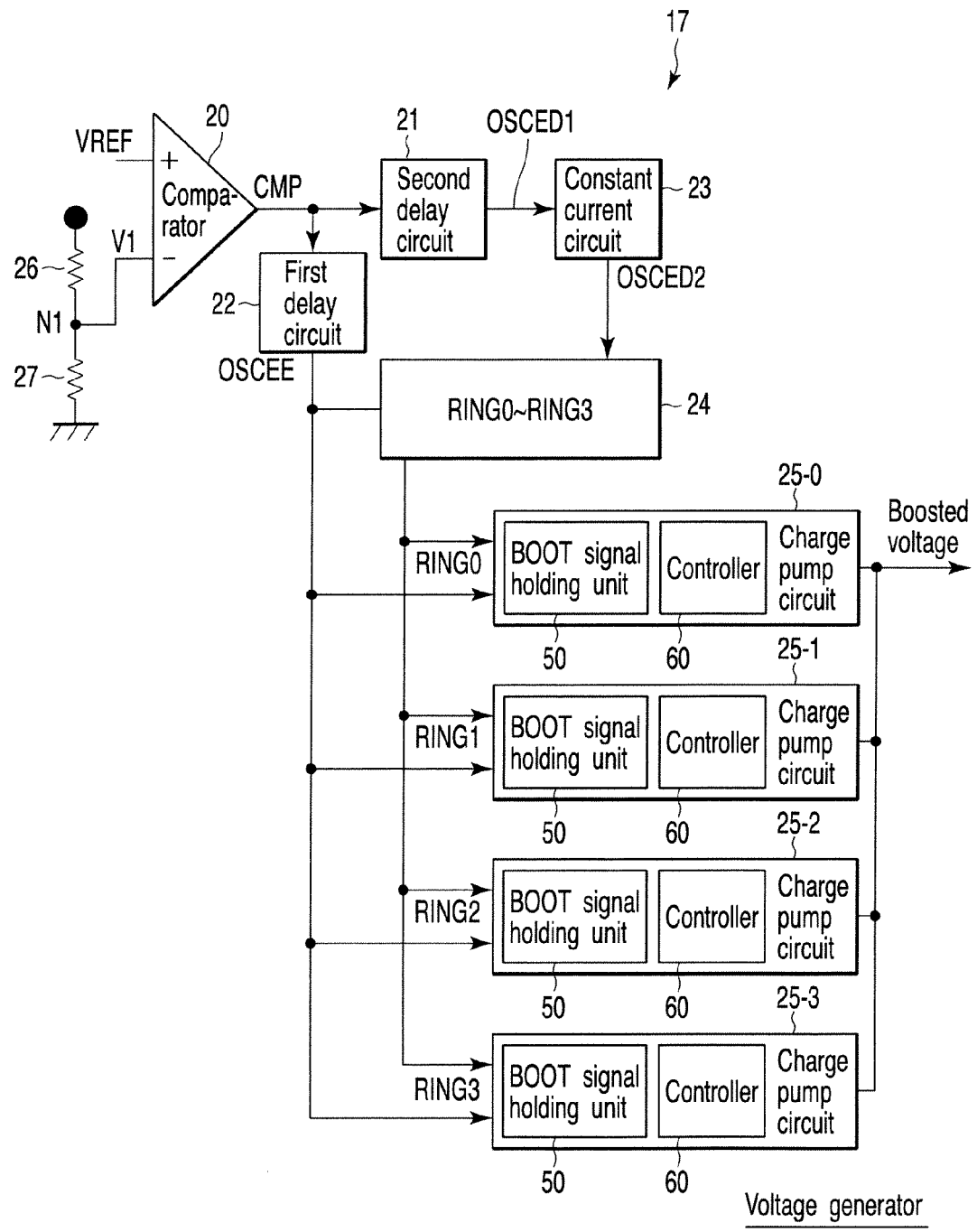
F I G. 11

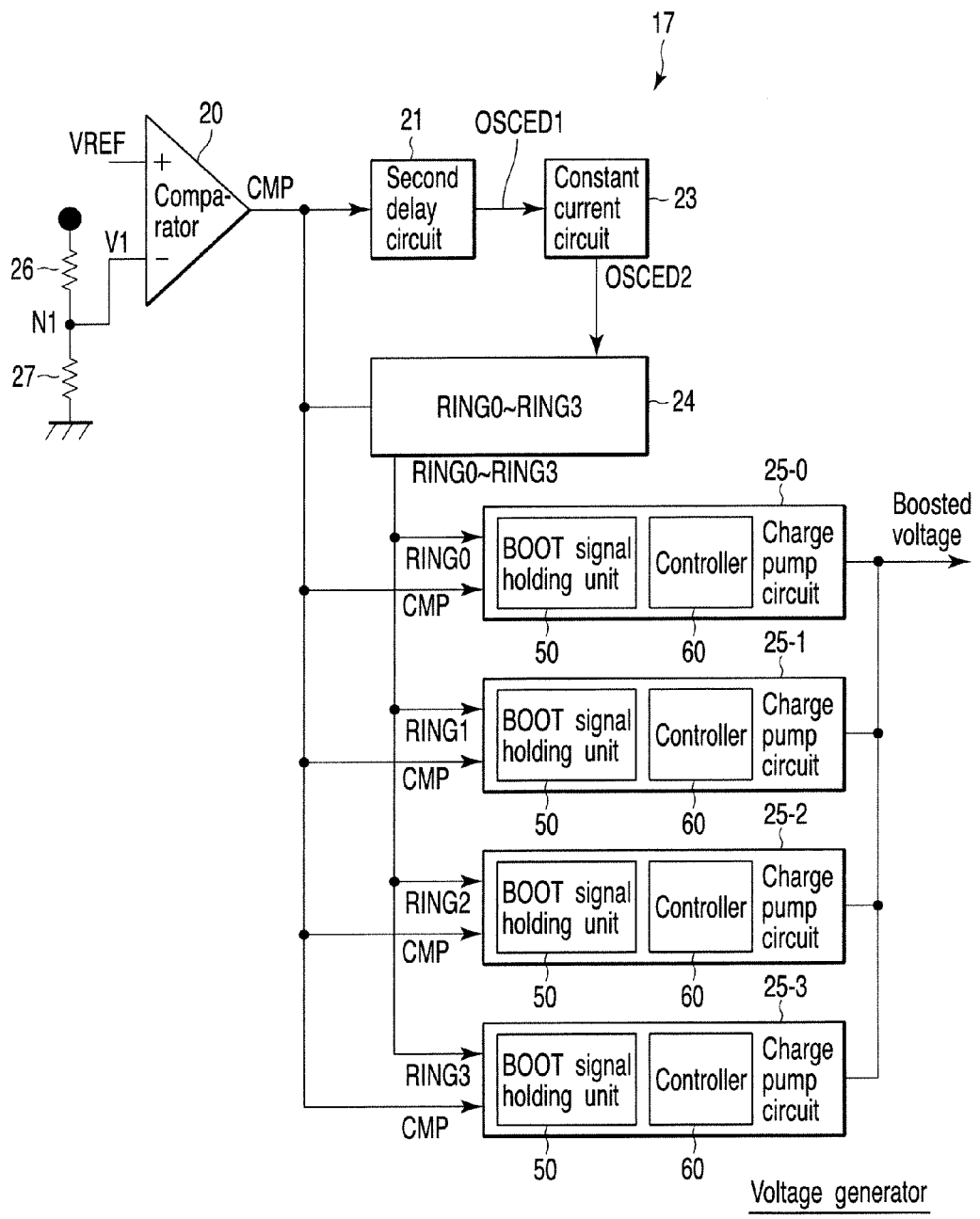
F I G. 16

SEMICONDUCTOR MEMORY DEVICE

CROSS-REFERENCE TO RELATED APPLICATIONS

This application is based upon and claims the benefit of priority from prior Japanese Patent Application No. 2006-294932, filed Oct. 30, 2006, the entire contents of which are incorporated herein by reference.

BACKGROUND OF THE INVENTION

1. Field of the Invention

The present invention relates to a semiconductor memory device. For example, the present invention relates to the arrangement of a voltage generator that generates a boosted voltage to be used inside a semiconductor memory device.

2. Description of the Related Art

Conventional nonvolatile semiconductor memories use a boosted voltage obtained by boosting an external voltage. A voltage generator that generates this boosted voltage normally includes a plurality of charge pump circuits in order to ensure the boosting ability of the voltage generator (e.g., patent reference 1).

In the conventional voltage generator, however, a large electric current sometimes flows through a plurality of charge pump circuits because the charge pump circuits are sometimes simultaneously turned on depending on the state of a control signal that controls the charge pump circuits or the control signal itself is unstable. This electric current produces noise and causes a data read error. This problem is particularly serious when a read operation and one of a write operation and erase operation are simultaneously performed across different memory blocks (this operation is called a dual operation).

[Patent reference 1] Jpn. Pat. Appln. KOKAI Publication No. 2000-331489

BRIEF SUMMARY OF THE INVENTION

A semiconductor memory device according to the first aspect of the present invention comprising a memory cell array in which a plurality of memory cells each having a charge storage layer and a control gate formed on an intergate insulating film on the charge storage layer are arranged in a matrix, word lines each of which connects the control gates of the memory cells on the same row together in the memory cell array, a row decoder which selects a word line, and applies a voltage to the selected word line, and a voltage generator which generates a boosted voltage, and outputs the boosted voltage as the voltage, the voltage generator including a comparator which compares a first voltage with a second voltage, and outputs a comparison result signal, a constant current circuit which generates a first control signal in accordance with the comparison result signal output from the comparator, a first delay circuit which generates a second control signal by delaying the comparison result signal output from the comparator, and a charge pump circuit which generates the boosted voltage in response to the first control signal and the second control signal.

A semiconductor memory device according to the second aspect of the present invention comprising a memory cell array in which a plurality of memory cells each having a charge storage layer and a control gate formed on an intergate insulating film on the charge storage layer are arranged in a matrix, word lines each of which connects the control gates of the memory cells on the same row together in the memory cell array, a row decoder which selects a word line, and applies a voltage to the selected word line, and a voltage generator which generates a boosted voltage, and outputs the boosted voltage as the voltage, the voltage generator including a comparator which compares a first voltage with a second voltage, and outputs a comparison result signal, a constant current circuit which generates a first control signal in accordance with the comparison result signal output from the comparator, and a charge pump circuit having a control signal generator, a booster, and a holding unit, the control signal generator generating a second control signal by using the comparison result signal and the first control signal, the booster generating the boosted voltage in response to the second control signal, and the holding unit holding the second control signal when the comparison result signal is disabled, and controlling the booster by the held second control signal.

A semiconductor memory device according to the third aspect of the present invention comprising a memory cell array in which a plurality of memory cells each having a charge storage layer and a control gate formed on an intergate insulating film on the charge storage layer are arranged in a matrix, word lines each of which connects the control gates of the memory cells on the same row together in the memory cell array, a row decoder which selects a word line, and applies a voltage to the selected word line, and a voltage generator which generates a boosted voltage, and outputs the boosted voltage as the voltage, the voltage generator including a comparator which compares a first voltage with a second voltage, and outputs a comparison result signal, a constant current circuit which generates a first control signal in accordance with the comparison result signal output from the comparator, and a plurality of charge pump circuits each of which generates the boosted voltage in response to the comparison result signal and the first control signal, and each of the charge pump circuits including a control signal generator which generates a second control signal by using the comparison result signal and the first control signal, a booster which generates the boosted voltage in response to the second control signal, a holding unit which holds the second control signal when the comparison result signal is disabled, and controls the booster by the held second control signal, and a controller which operates the control signal generator to produce time differences between the charge pump circuits when the comparison result signal is enabled.

BRIEF DESCRIPTION OF THE SEVERAL VIEWS OF THE DRAWING

FIG. 7 is a block diagram of a voltage generator of an EEPROM according to the second embodiment of the present invention;

FIG. 11 is a block diagram of a voltage generator of an EEPROM according to the third embodiment of the present invention;

FIG. 16 is a block diagram of a voltage generator of an EEPROM according to a modification to the second and third embodiments of the present invention.

DETAILED DESCRIPTION OF THE INVENTION

Figure 1:
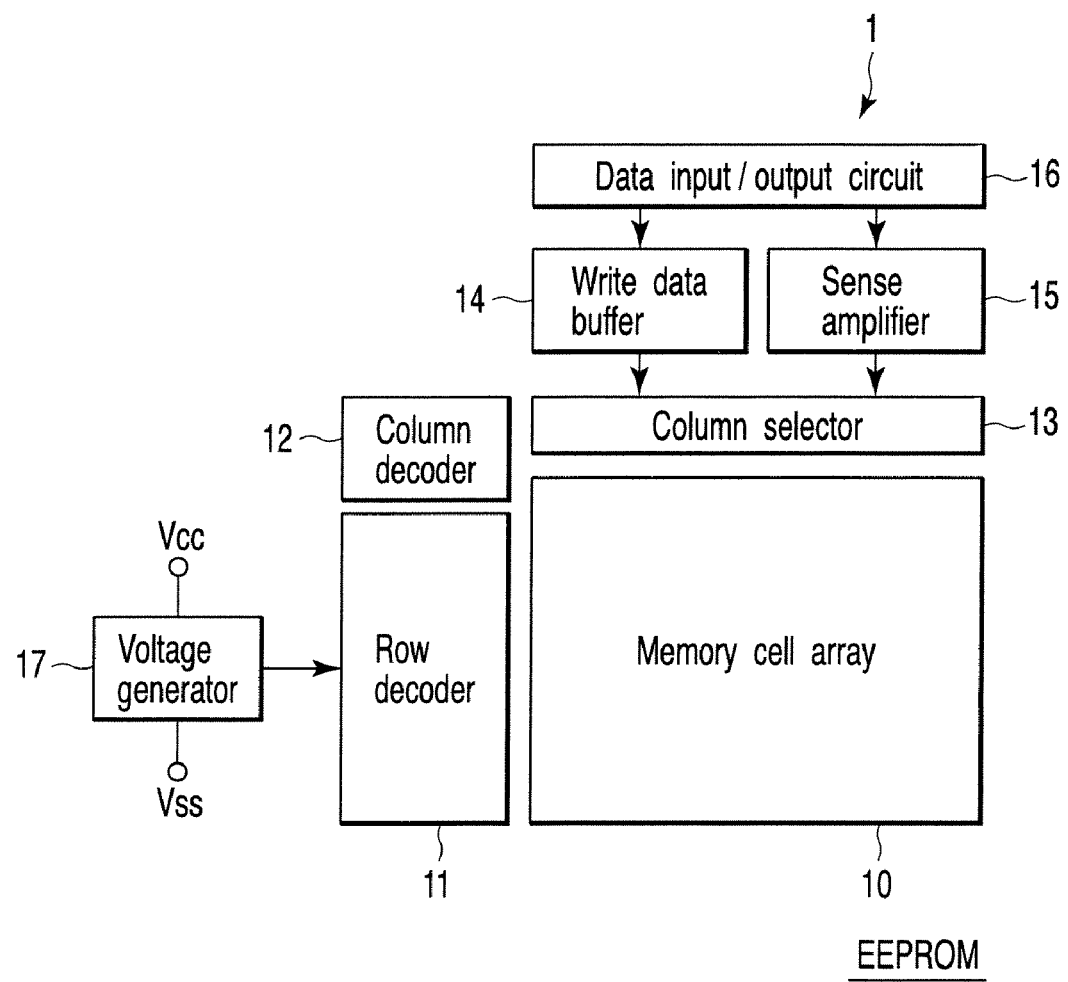
FIG. 1 is a block diagram of an EEPROM according to the first embodiment of the present invention.

Embodiments of the present invention will be explained below with reference to the accompanying drawing. In the following explanation, the same reference numerals denote the same parts throughout the drawing.

First Embodiment

A semiconductor memory device according to the first embodiment of the present invention will be explained below. FIG. 1 is a block diagram of a nonvolatile semiconductor memory device according to this embodiment, and shows a NOR EEPROM as an example.

As shown in FIG. 1, an EEPROM 1 comprises a memory cell array 10, row decoder 11, column decoder 12, column selector 13, write data buffer 14, sense amplifier 15, data input/output circuit 16, and voltage generator 17.

The memory cell array 10 includes a plurality of NOR flash memory cells arranged in a matrix. Each memory cell is connected to a bit line, word line, and source line. The row decoder 11 performs selection in the row direction of the memory cell array 10, i.e., selects a word line. The column decoder 12 performs selection in the column direction of the memory cell array 10. The column selector 13 selects a bit line on the basis of the selecting operation of the column decoder 12, and connects the selected bit line to the write data buffer 14 or sense amplifier 15. The sense amplifier 15 senses and amplifies data read from a memory cell selected by the row decoder 11 and column decoder 12. The write data buffer 14 holds data to be written in a memory cell, and simultaneously writes data in every predetermined number of memory cells. The data input/output circuit 16 receives externally supplied write data, transfers the data to the write data buffer 14, and outputs read data amplified by the sense amplifier outside.

The voltage generator 17 operates by using external voltages Vcc and Vss (e.g., the ground potential), and generates a boosted voltage by boosting the external voltage Vcc. The voltage generator 17 supplies the generated boosted voltage to, e.g., the row decoder 11, memory cell array 10, write data buffer 14, and sense amplifier 15.

Figure 2:
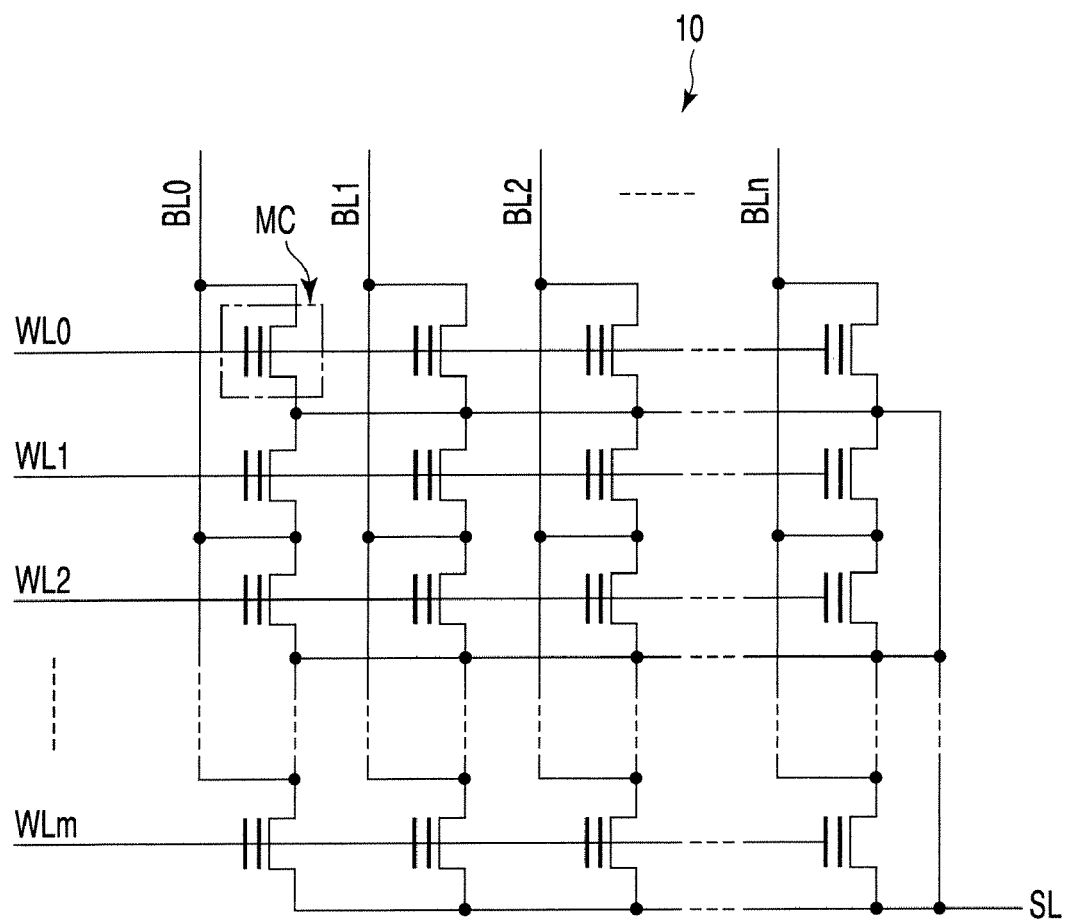
FIG. 2 is a circuit diagram of a memory cell array of the EEPROM according to the first embodiment of the present invention.

The arrangement of the memory cell array 10 will be explained next with reference to FIG. 2. FIG. 2 is a circuit diagram showing the arrangement of the memory cell array. As shown in FIG. 2, the memory cell array 10 has ((m+1)×(n+1)) (m and n are natural numbers) memory cells MC. Each memory cell MC is a MOS transistor having a stacked gate including a charge storage layer (e.g., a floating gate) and control gate. The charge storage layer is formed on a gate insulating film on a semiconductor substrate. The control gate is formed on an inter-gate insulating film on the charge storage layer. The control gates of the memory cells MC on the same row are connected together to one of word lines WL0 to WLm. The drains of the memory cells MC in the same column are connected together to one of bit lines BL0 to BLn. The sources of the memory cells MC are connected together to the same source line SL.

Figure 3:
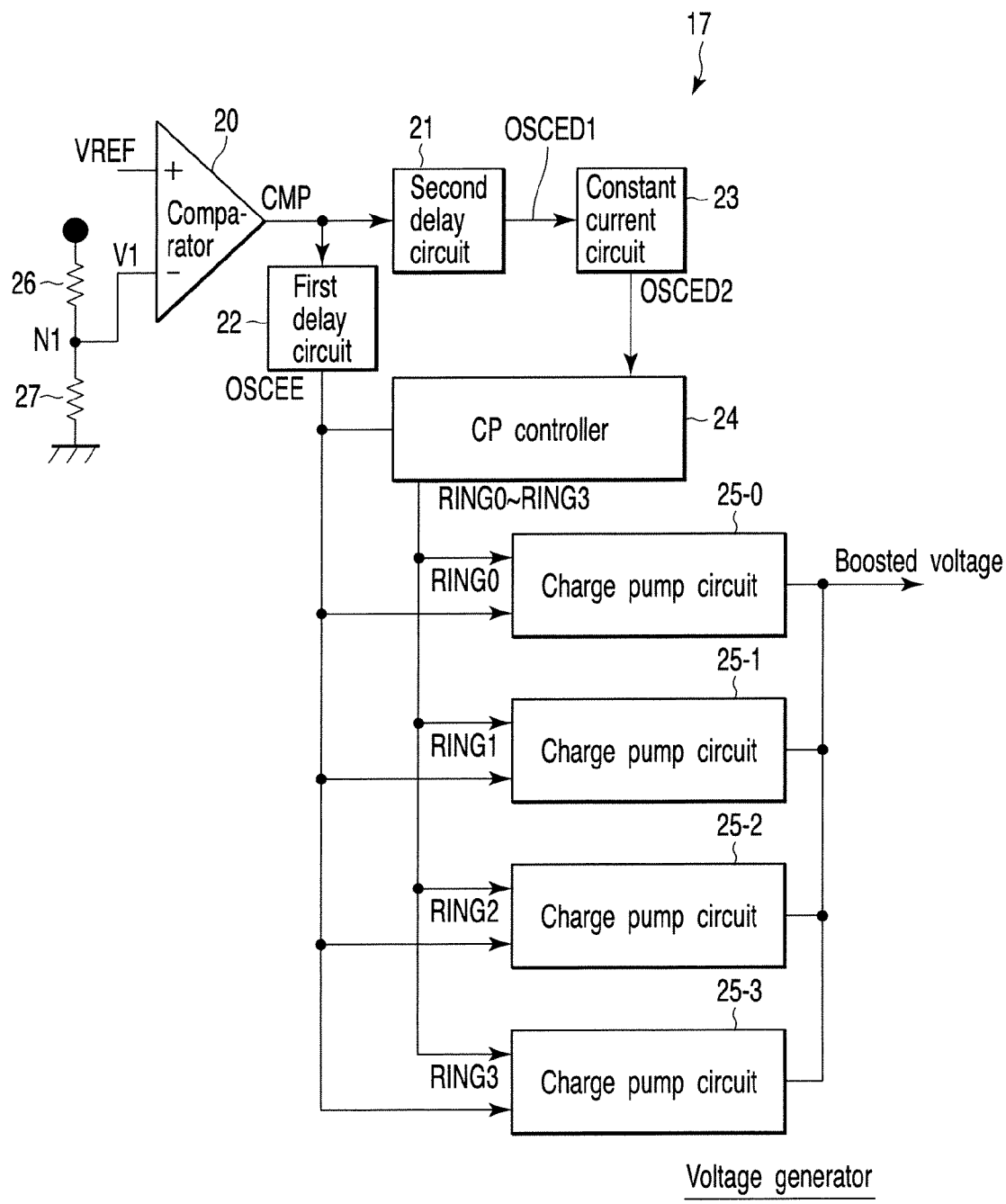
FIG. 3 is a block diagram of a voltage generator of the EEPROM according to the first embodiment of the present invention.

The arrangement of the voltage generator 17 will now be explained with reference to FIG. 3. FIG. 3 is a block diagram showing the arrangement of the voltage generator 17. As shown in FIG. 3, the voltage generator 17 comprises a comparator 20, a first delay circuit 22, a second delay circuit 21, a constant current circuit 23, a charge pump controller 24, four charge pump circuits 25-0 to 25-3, and resistance elements 26 and 27.

The comparator 20 compares a voltage Vref with a voltage V1, and outputs the comparison result as a comparison result signal CMP. The voltage Vref is a reference voltage generated by, e.g., a bandgap reference circuit. The voltage V1 is the voltage at a connection node N1 between the resistance elements 26 and 27, and determined by the voltage dividing ratio of the resistance elements 26 and 27. If the voltage V1 is lower than the voltage Vref, the comparator 20 makes the comparison result signal CMP high.

The second delay circuit 21 delays the comparison result signal CMP output from the comparator 20, and outputs the delayed comparison result signal CMP as a control signal OSCED1.

The first delay circuit 22 delays the comparison result signal CMP output from the comparator 20, and outputs the delayed comparison result signal CMP as a control signal OSCEE.

The constant current circuit 23 generates a reference voltage OSCED2 on the basis of the signal OSCED1.

On the basis of the reference voltage OSCED2, the charge pump controller (oscillator circuit) 24 generates control signals RING0 to RING3. The signals RING0 to RING3 are pulse signals that respectively enable or disable the charge pump circuits 25-0 to 25-3. The signals RING0 to RING3 have phases shifted from one another, and are made high or low in the order of the signals RING0 to RING3. Note that the signals RING0 to RING3 will be collectively referred to as signals RING when it is unnecessary to distinguish between them.

The charge pump circuits 25-0 and 25-3 operate on the basis of the signal OSCEE and signals RING0 to RING3, and generate a boosted voltage by boosting, e.g., the external voltage Vcc. In the following explanation, the charge pump circuits 25-0 to 25-3 will be collectively referred to as charge pump circuits 25 when it is unnecessary to distinguish between them.

Figure 4:
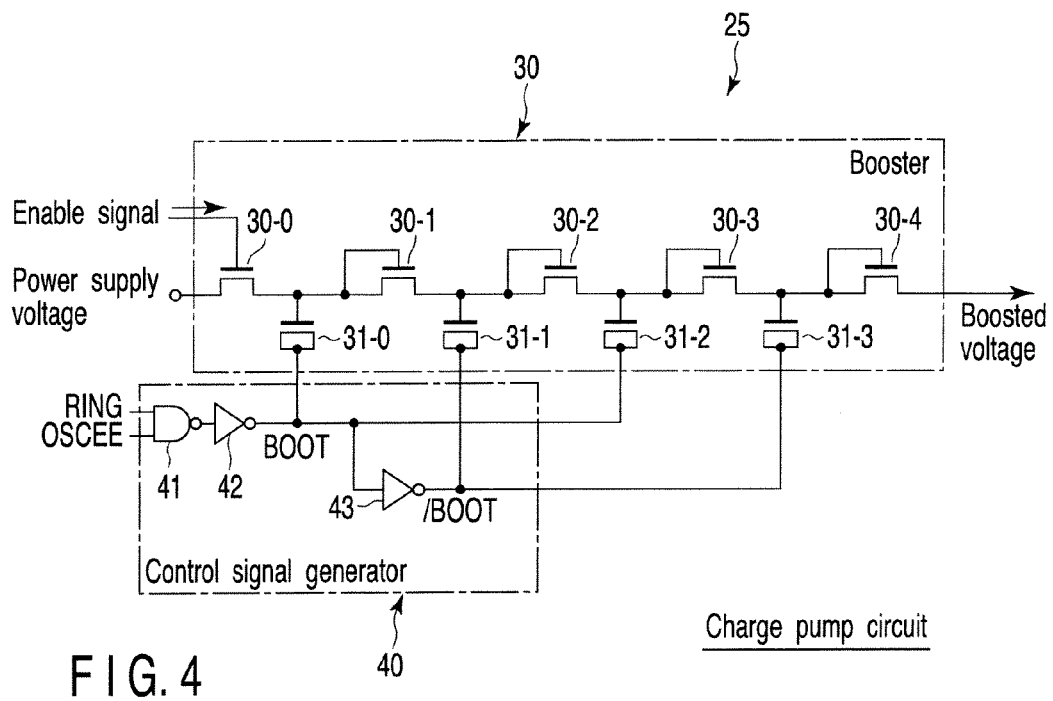
FIG. 4 is a circuit diagram of a charge pump circuit of the EEPROM according to the first embodiment of the present invention.

Next, the arrangement of the charge pump circuit 25 will be explained with reference to FIG. 4. FIG. 4 is a circuit diagram of the charge pump circuit 25. As shown in FIG. 4, the charge pump circuit 25 generally comprises a booster 30 and control signal generator 40.

First, the arrangement of the booster 30 will be explained. The booster 30 comprises, e.g., five MOS transistors 30-0 to 30-4 and four MOS transistors 31-0 to 31-3. An enable signal is input to the gate of the MOS transistor 30-0, and the power supply voltage (e.g., Vss) is applied to one end of the current path of the MOS transistor 30-0. The gate and one end of the current path of the MOS transistor 30-1 are connected to the other end of the current path of the MOS transistor 30-0. The gate and one end of the current path of the MOS transistor 30-2 are connected to the other end of the current path of the MOS transistor 30-1. The gate and one end of the current path of the MOS transistor 30-3 are connected to the other end of the current path of the MOS transistor 30-2. The gate and one end of the current path of the MOS transistor 30-4 are connected to the other end of the current path of the MOS transistor 30-3. The voltage at the other end of the current path of the MOS transistor 30-4 is output as the boosted voltage of the charge pump circuit 25.

The gate of the MOS transistor 31-0 is connected to a connection node between the current paths of the MOS transistors 30-0 and 30-1, and one end and the other end of the current path of the MOS transistor 31-0 are connected together. The gate of the MOS transistor 31-1 is connected to a connection node between the current paths of the MOS transistors 30-1 and 30-2, and one end and the other end of the current path of the MOS transistor 31-1 are connected together. The gate of the MOS transistor 31-2 is connected to a connection node between the current paths of the MOS transistors 30-2 and 30-3, and one end and the other end of the current path of the MOS transistor 31-2 are connected together. The gate of the MOS transistor 31-3 is connected to a connection node between the current paths of the MOS transistors 30-3 and 30-4, and one end and the other end of the current path of the MOS transistor 31-3 are connected together.

That is, in the booster 30, the MOS transistors 30-0 to 30-4 function as five series-connected diodes, and the cathode potential of the diode in the final stage is the boosted voltage. The MOS transistors 31-0 to 31-3 function as capacitor elements.

The control signal generator 40 will now be explained. The control signal generator 40 comprises a NAND gate 41 and inverters 42 and 43. The NAND gate 41 NANDs the signals RING and OSCEE. The inverter 42 inverts the operation result from the NAND gate 41, and outputs the inverted signal as a control signal BOOT. The inverter 43 inverts the signal BOOT, and outputs the inverted signal as a control signal /BOOT.

The signal BOOT is supplied to one end and the other end of the current path of each of the MOS transistors 31-0 and 31-2. The signal /BOOT is supplied to one end and the other end of the current path of each of the MOS transistors 31-1 and 31-3.

In the above arrangement, the charge pump circuit 25 is enabled when the signals OSCEE and RING are asserted. That is, when the signal OSCEE is asserted, OSCEE=High and the signal RING toggles repeatedly. When RING=High, BOOT=High and /BOOT=Low. When RING=Low, BOOT=Low and /BOOT=High. The signal BOOT is supplied to the MOS transistors (capacitor elements) 31-0 and 31-2 in even-numbered stages. The signal /BOOT is supplied to the MOS transistors (capacitor elements) 31-1 and 31-3 in odd-numbered stages. The boosted voltage is generated by thus alternately applying the potential to the even-numbered capacitor elements and odd-numbered capacitor elements.

The operation of the NOR flash memory having the above arrangement will be briefly explained below.

<Write Operation>

A write operation will be explained first. The data input/output circuit 16 supplies write data to the write data buffer 14. The column decoder 12 selects a bit line BL, and the column selector 13 connects the selected bit line BL to the write data buffer 14. The write data buffer 14 applies, e.g., 5 V to the selected bit line BL. Note that the source line SL is grounded. The row decoder 11 selects a word line WL, and applies, e.g., 10 V to the selected word line WL. This voltage of 10 V is the boosted voltage generated by the voltage generator 17.

In a memory cell MC connected to the selected bit line BL and selected word line WL, hot electrons generated by an electric current flowing from the drain to the source are injected into the floating gate. As a consequence, data "0" is written in the memory cell MC.

<Read Operation>

A read operation will now be explained. In a read operation, the column selector 13 connects a selected bit line BL to the sense amplifier 15 in accordance with the selecting operation of the column decoder 12. The sense amplifier 15 precharges the selected bit line BL to, e.g., 1 V.

The row decoder 11 selects a word line, and applies, e.g., 5 V to the selected word line WL. Consequently, an electric current flows through a memory cell in a state "1", and no electric current flows through a memory cell in a state "0". The sense amplifier 15 senses this electric current to read data "0" or "1".

<Erase Operation>

Next, erase operation will be explained below. Data is simultaneously erased from a plurality of memory cells MC. First, the row decoder 11 applies the boosted voltage (e.g., 10 V) generated by the voltage generator 17 to the semiconductor substrate (well region) on which the memory cell array 10 is formed. The row decoder 11 also applies a negative voltage (−8 V) to a plurality of word lines WL. This voltage of −8 V may also be generated by the voltage generator 17. A negative voltage can be generated by reversing the connections between the cathodes and anodes of the diodes (MOS transistors 30-0 to 30-4) shown in FIG. 4. The boosted voltage is also applied to the source line.

Consequently, a high electric field is applied to the gate insulating film of the memory cell, and electrons in the floating gate move to the source by FN tunneling. This erases the data from the memory cell MC, so the data of the memory cell becomes "1".

As described above, the EEPROM according to the first embodiment of the present invention achieves effect (1) below.

(1) The operation reliability of the EEPROM can improve (No. 1).

In the EEPROM according to this embodiment, the voltage generator 17 that generates the boosted voltage has the first delay circuit 22. This makes it possible to prevent the generation of a peak current in the charge pump circuit 25, thereby improving the operation reliability of the EEPROM. This effect will be explained below.

Figure 5:
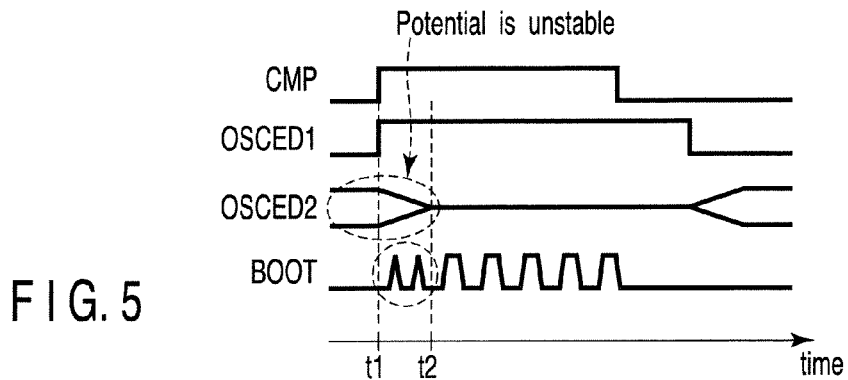
FIG. 5 is a timing chart of various signals in a charge pump circuit.

FIG. 5 is a timing chart of various signals when the first delay circuit 22 is omitted from FIG. 3. As shown in FIG. 5, assume that the signal CMP goes high at time t1. Note that the second delay circuit 21 delays only the rising timing of the signal CMP. Accordingly, the signal OSCED1 also goes high at time t1. This asserts the signals OSCED2 and RING at almost time t1. When the first delay circuit 22 is omitted, therefore, the NAND gate 41 of the charge pump circuit 25 NANDs the signals RING and CMP. As a consequence, the signal BOOT is asserted at time t1. That is, the booster 30 is already activated and starts boosting at time t1.

Immediately after the signal OSCED1 is asserted, however, the operation of the constant current circuit 23 is sometimes unstable. If, for example, the output voltage OSCED2 of the constant current circuit 23 is unstable during the period from time t1 to time t2 as shown in FIG. 5, the signal BOOT sometimes becomes a pulse having a very short cycle in this period. If this phenomenon occurs, the booster 30 generates an electric current (called a peak current) larger than necessary. This large electric current produces noise. For example, the Vcc node and Vss node to which the voltage generator 17 supplies the voltage produce noise, thereby making the operation of each circuit block in the EEPROM 1 unstable. This noise also poses problems such as a read error.

Figure 6:
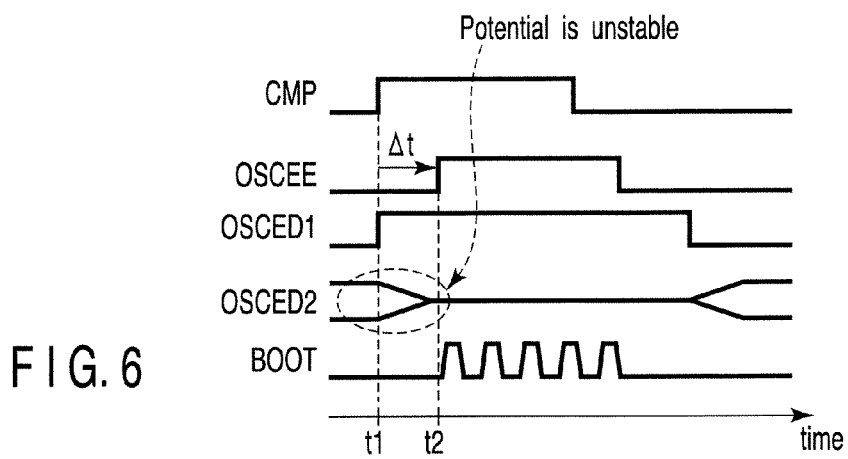
FIG. 6 is a timing chart of various signals in the charge pump circuit according to the first embodiment of the present invention.

In contrast, this embodiment can suppress the generation of the peak current described above. This will be explained below with reference to FIG. 6. FIG. 6 is a timing chart of various signals in the voltage generator 17 according to this embodiment. As shown in FIG. 6, in the arrangement according to this embodiment, the first delay circuit 22 delays the signal CMP by Δt to form the signal OSCEE. In other words, the signal OSCEE goes high with a delay of the period Δt from the signal OSCED1. The charge pump circuit 25 is enabled in response to the signals OSCEE and RING. That is, the charge pump circuit 25 is enabled with a delay of the period Δt from the case explained in FIG. 5. As a consequence, the charge pump circuit 25 operates without being influenced by the period from time t1 to time t2 during which the electric current is unstable. This makes it possible to suppress the generation of the peak current in the charge pump circuit 25, and suppress the production of noise in the voltages Vcc and Vss. Accordingly, the operation reliability of the EEPROM can improve.

Second Embodiment

A semiconductor memory device according to the second embodiment of the present invention will be explained below. In this embodiment, a charge pump circuit 25 includes a holding circuit that holds a signal BOOT in the first embodiment. Therefore, the arrangements and operations except for a voltage generator 17 are the same as in the first embodiment, so a repetitive explanation will be omitted.

Figure 8:
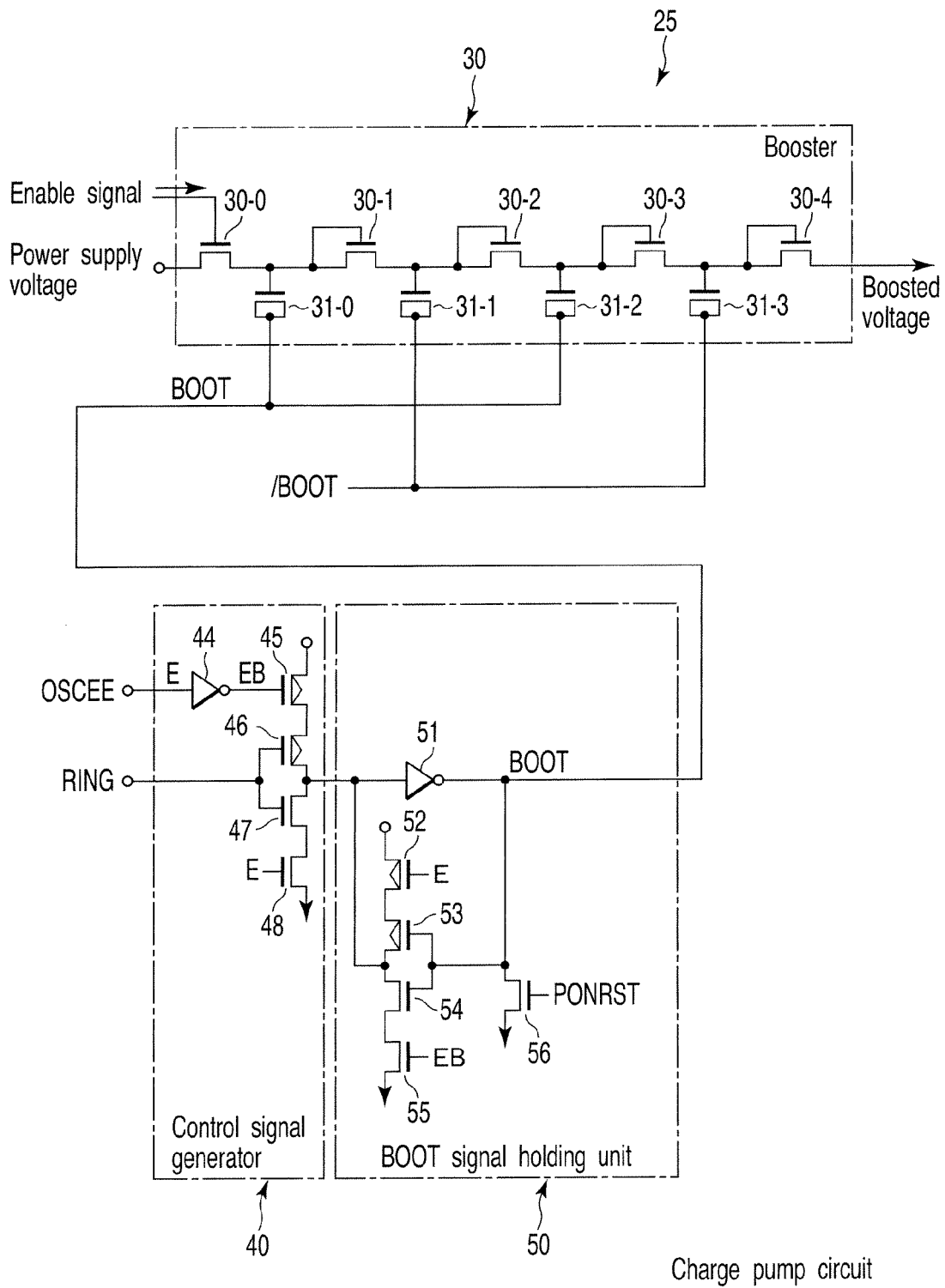
FIG. 8 is a circuit diagram of a charge pump circuit of the EEPROM according to the second embodiment of the present invention.

FIG. 7 is a circuit diagram of the voltage generator 17 according to this embodiment. As shown in FIG. 7, charge pump circuits 25-0 to 25-3 each have a BOOT signal holding unit 50 that holds the signal BOOT. The configuration of each charge pump circuit 25 will be explained with reference to FIG. 8. FIG. 8 is a circuit diagram of the charge pump circuit 25.

As shown in FIG. 8, the charge pump circuit 25 comprises a booster 30, a control signal generator 40, and the BOOT signal holding unit 50. The arrangement of the booster 30 is the same as that shown in FIG. 4 of the first embodiment, so a repetitive explanation will be omitted.

The control signal generator 40 comprises an inverter 44, p-channel MOS transistors 45 and 46, and n-channel MOS transistors 47 and 48. The input node of the inverter 44 receives a signal OSCEE as an enable signal E. The inverter 44 inverts the enable signal E, and outputs an inverted enable signal EB. The MOS transistor 45 has a source connected to the power supply potential (e.g., Vcc), a gate that receives the signal EB, and a drain connected to the source of the MOS transistor 46. The MOS transistor 46 has a gate that receives a signal RING, and a drain connected to the drain of the MOS transistor 47. The MOS transistor 47 has a gate that receives the signal RING, and a source connected to the drain of the MOS transistor 48. The MOS transistor 48 has a gate that receives the signal E, and a source connected to the power supply potential (e.g., Vss). The potential at a connection node between the drains of the MOS transistors 46 and 47 is output as a signal /BOOT.

In the above arrangement, when OSCEE=High, signal E=High and signal EB=Low, so the MOS transistors 45 and 48 are turned on. Accordingly, signal /BOOT=Low (BOOT=High) when signal OSCEE=RING=High (asserted).

Next, the BOOT signal holding unit 50 will be explained below. The BOOT signal holding unit 50 comprises an inverter 51, p-channel MOS transistors 52 and 53, and n-channel MOS transistors 54, 55, and 56. The input node of the inverter 51 is connected to the output node of the control signal generator 40. That is, the inverter 51 inverts the signal /BOOT, and outputs the signal BOOT from the output node. The MOS transistor 52 has a source connected to the power supply potential (e.g., Vcc), a gate that receives the signal E, and a drain connected to the source of the MOS transistor 53. The MOS transistor 53 has a gate connected to the output node of the inverter 51, and a drain connected to the drain of the MOS transistor 54. The MOS transistor 54 has a gate connected to the output node of the inverter 51, and a source connected to the drain of the MOS transistor 54. The MOS transistor 55 has a gate that receives the signal EB, and a source connected to the power supply potential (e.g., Vss). A connection node between the drains of the MOS transistors 53 and 54 is connected to the input node of the inverter 51.

That is, the MOS transistors 52 to 55 function as a clocked inverter using the signals E and EB as clocks. Accordingly, the MOS transistors 52 to 55 become inoperable when signal E=High and signal EB=Low, and become operable when signal E=Low and signal EB=High. This inverter has an input node connected to the output node of the inverter 51, and an output node connected to the input node of the inverter 51. When this inverter is in operation, therefore, this inverter and the inverter 51 form a latch circuit, and this latch circuit latches the signal BOOT.

The MOS transistor 56 has a drain connected to the output node of the inverter 51, a gate that receives a signal PONRST, and a source that is grounded. The MOS transistor 56 is turned on when initializing the signal BOOT (to low) to be held in the latch circuit described above.

As described above, the EEPROM according to the second embodiment of the present invention achieves effect (2) below in addition to effect (1) explained in the first embodiment.

(2) The operation reliability of the EEPROM can improve (No. 2).

In the EEPROM according to this embodiment, the charge pump circuit 25 has the BOOT signal holding unit 50 that holds the signal BOOT. This makes it possible to prevent the generation of a peak current in the charge pump circuit 25, thereby improving the operation reliability of the EEPROM. This effect will be explained below.

Figure 9:
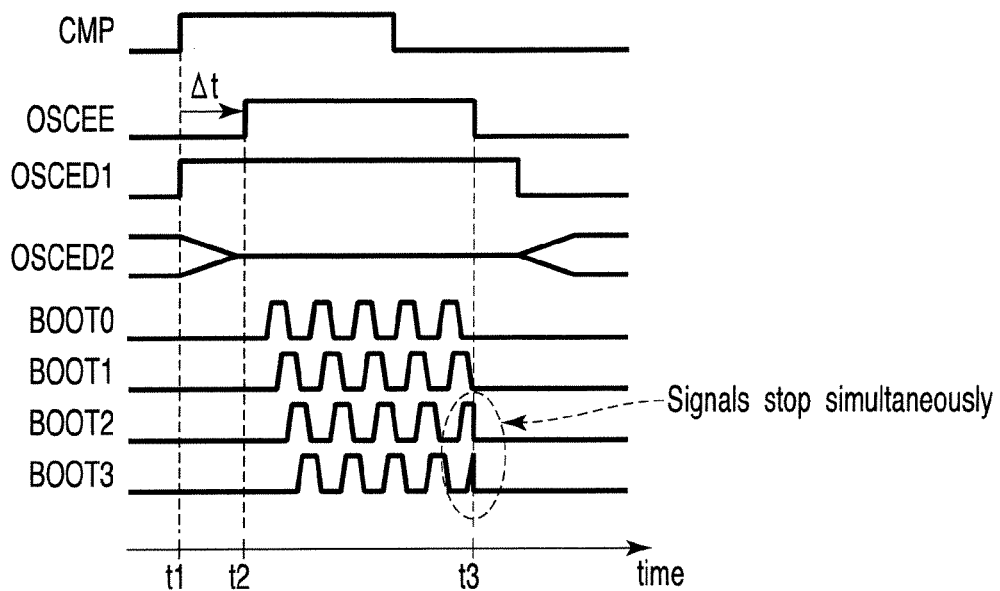
FIG. 9 is a timing chart of various signals in a charge pump circuit.

FIG. 9 is a timing chart of various signals in an arrangement corresponding to the first embodiment. Referring to FIG. 9, signals BOOT0 to BOOT3 respectively mean the signals BOOT generated by the charge pump circuits 25-0 to 25-3. As shown in FIG. 9, the signals BOOT0 to BOOT3 are asserted with time differences between them. That is, first pulses are generated in the order of the signals BOOT0 to BOOT3. This is so because signals RING0 to RING3 are asserted with time differences between them.

When the signal OSCEE is disabled (made low), however, the signals BOOT0 to BOOT3 are simultaneously disabled (made low) (time t3 in FIG. 9). Assume that the signals BOOT2 and BOOT3 shown in FIG. 9 simultaneously go low at time t3. When the states of a plurality of signals BOOT simultaneously change due to the signal OSCEE as in this case, the booster 30 generates a peak current.

Figure 10:
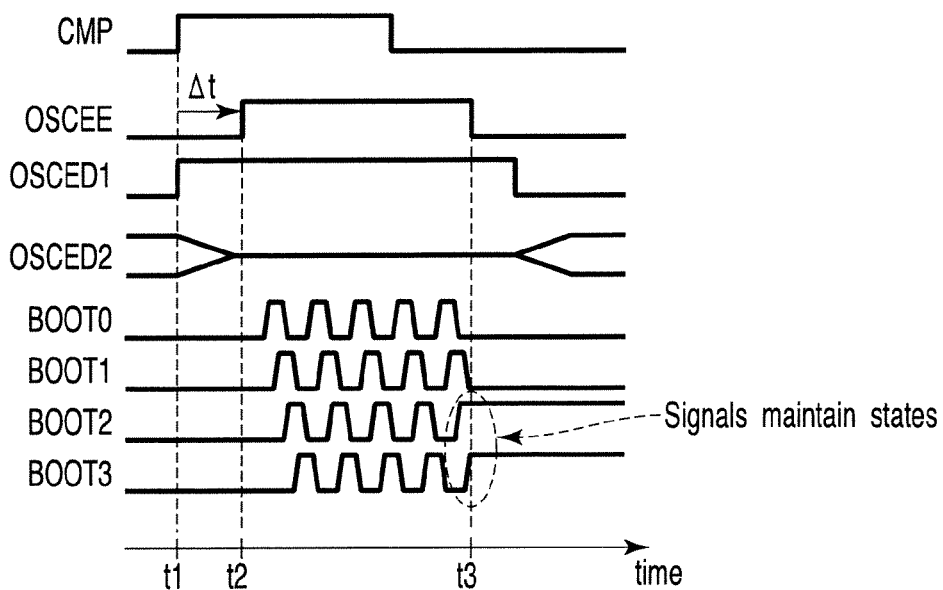
FIG. 10 is a timing chart of various signals in the charge pump circuit according to the second embodiment of the present invention.

In contrast, this embodiment can suppress the generation of the peak current. This will be explained below with reference to FIGS. 8 and 10. FIG. 10 is a timing chart of various signals in the voltage generator 17 according to this embodiment. Similar to FIG. 9, the signals BOOT0 to BOOT3 are respectively the signals BOOT generated by the charge pump circuits 25-0 to 25-3.

In the arrangement according to this embodiment as shown in FIGS. 8 and 10, the BOOT signal holding unit 50 latches the signal BOOT. The operation of the booster 30 is controlled on the basis of the latched signal BOOT. When the signal OSCEE is disabled, the BOOT signal holding unit 50 keeps holding the state of the signal BOOT at that point. That is, in the example shown in FIG. 10, the signals BOOT2 and BOOT3 stay high. Accordingly, the generation of the peak current can be suppressed. The operations of the charge pump circuits 25 in this case will be explained below.

In the charge pump circuits 25-2 and 25-3 immediately before time t3, signal OSCEE=High and signal RING=High. In the control signal generators 40, therefore, the MOS transistors 47 and 48 are turned on, and both signals /BOOT2 and /BOOT3 are low, i.e., BOOT2=BOOT3=High. Also, since OSCEE=High, the MOS transistors 52 and 55 in the BOOT signal holding units 50 are turned on, so the inverters 51 and MOS transistors 52 to 55 function as latch circuits to hold BOOT2=BOOT3=High.

In this state, the signal OSCEE goes low at time t3. Accordingly, the MOS transistors 45 and 48 are turned off in the control signal generators 40. That is, the control signal generators 40 are disabled. Therefore, the BOOT signal holding units 50 keep holding the signals BOOT2 and BOOT3 that have been held to that point. That is, the output nodes of the BOOT signal holding units 50 stay high.

As described above, when the signal OSCEE goes low, the control signal generators 40 are disabled instantaneously, so the signal OSCEE has no influence on the signals BOOT. Accordingly, the states of the signals BOOT remain unchanged and are constant. This makes it possible to prevent a plurality of charge pump circuits 25 from being simultaneously turned off as shown in FIG. 9.

Third Embodiment

A semiconductor memory device according to the third embodiment of the present invention will be explained below. This embodiment further comprises a controller that controls the rising timings of signals BOOT in the second embodiment. Therefore, the arrangements and operations except for a voltage generator 17 are the same as in the first and second embodiments, so a repetitive explanation will be omitted.

Figure 12:
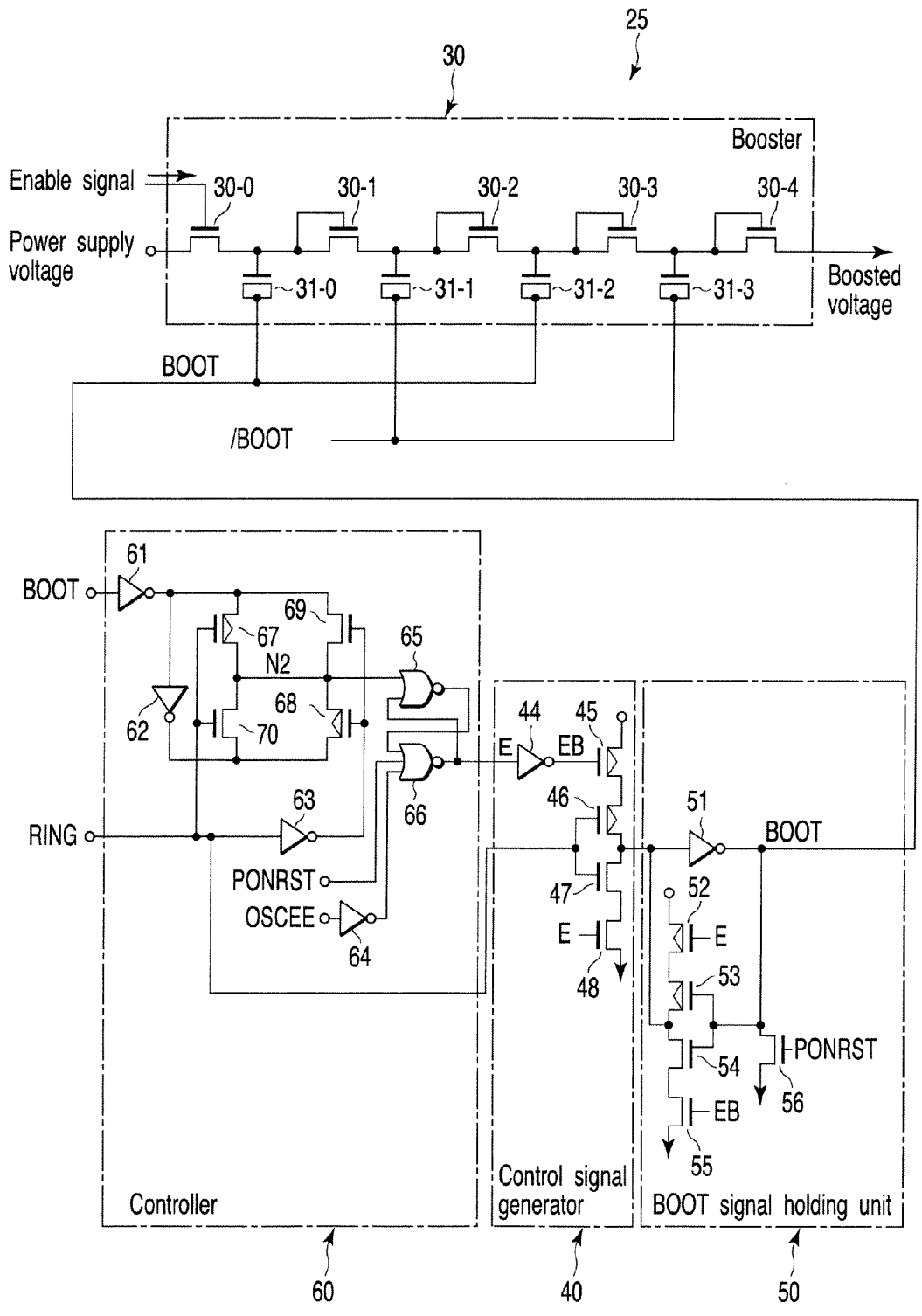
FIG. 12 is a circuit diagram of a charge pump circuit of the EEPROM according to the third embodiment of the present invention.

FIG. 11 is a circuit diagram of the voltage generator 17 according to this embodiment. As shown in FIG. 11, each of charge pump circuits 25-0 to 25-3 has a controller 60 in addition to a BOOT signal holding unit 50 that holds a signal BOOT. The configuration of each charge pump circuit 25 will be explained with reference to FIG. 12. FIG. 12 is a circuit diagram of the charge pump circuit 25.

As shown in FIG. 12, the charge pump circuit 25 comprises a booster 30, a control signal generator 40, the BOOT signal holding unit 50, and the controller 60. The arrangements of the booster 30, control signal generator 40, and BOOT signal holding unit 50 are the same as those shown in FIG. 4 of the first embodiment and FIG. 8 of the second embodiment, so a repetitive explanation will be omitted.

The controller 60 synchronizes the rising timing of the signal BOOT with a signal RING, thereby producing time differences between the charge pump circuits. As shown in FIG. 12, the controller 60 comprises inverters 61 to 64, NOR gates 65 and 66, p-channel MOS transistors 67 and 68, and n-channel MOS transistors 69 and 70.

The inverter 61 inverts the signal BOOT latched by the BOOT signal holding unit 50. The inverter 62 further inverts the signal BOOT inverted by the inverter 61. The inverter 63 inverts the signal RING. The inverter 64 inverts a signal OSCEE. The MOS transistor 67 has a source connected to the output node of the inverter 61, and a gate that receives the signal RING. The MOS transistor 70 has a source connected to the output node of the inverter 62, and a gate that receives the signal RING. The MOS transistor 69 has a source connected to the output node of the inverter 61, and a gate connected to the output node of the inverter 63. The MOS transistor 68 has a source connected to the output node of the inverter 62, and a gate connected to the output node of the inverter 63. The drains of the MOS transistors 67 to 70 are connected together (to a node to be referred to as a node N2 hereinafter). The NOR gates 65 NORs a signal at node N2 and a signal at the output node of the NOR gate 66. The NOR gate 66 NORs a signal at the output node of the inverter 64, a signal at the output node of the NOR gate 65, and a signal PONRST. The NOR gate 66 supplies the operation result as a signal E to the control signal generator 40 and BOOT signal holding unit 50.

The operation of the charge pump circuit 25 having the above configuration will be explained below. As explained in the second embodiment, the signal BOOT is generated by enabling the control signal generator 40 when the signal E goes high (i.e., when a signal EB goes low). In this embodiment, the signal E is given as the output from the NOR gate 66.

Accordingly, the signal OSCEE is initially made high. If the signals BOOT and RING match in this state, the output from the NOR gate 66, i.e., the signal E goes high.

<When BOOT=RING=High>

When BOOT=RING=High, the MOS transistors 68 and 70 are turned on, and the MOS transistors 67 and 69 are turned off. Since BOOT=High, the current paths of the MOS transistors 68 and 70 make node N2 high. Consequently, the output from the NOR gate 65 goes low, and the operation result from the NOR gate 66 goes high.

<When BOOT=RING=Low>

When BOOT=RING=Low, the MOS transistors 67 and 69 are turned on, and the MOS transistors 68 and 70 are turned off. Since BOOT=Low, the current paths of the MOS transistors 67 and 69 make node N2 high. Consequently, the output from the NOR gate 65 goes low, and the operation result from the NOR gate 66 goes high.

<When BOOT=High and RING=Low>

When BOOT=High and RING=Low, the MOS transistors 67 and 69 are turned on, and the MOS transistors 68 and 70 are turned off. Therefore, the current paths of the MOS transistors 67 and 69 make node N2 low. In this case, the signal E at the immediately preceding timing determines the operation result from the NOR gate 65. That is, if the control signal generator 40 is already asserted and signal E=High, the operation result from the NOR gate 65 goes low, and the operation result from the NOR gate 66 also goes low. On the other hand, if signal E=Low, the operation result from the NOR gate 65 goes high. Accordingly, the operation result from the NOR gate 66 stays low.

<When BOOT=Low and RING=High>

The case that BOOT=Low and RING=High is the same as the case that BOOT=High and RING=Low except for MOS transistors to be turned on. That is, the MOS transistors 68 and 70 are turned on, and the MOS transistors 67 and 69 are turned off. As a consequence, node N2 is made low. If signal E=High, therefore, the operation result from the NOR gate 65 goes low, and the operation result from the NOR gate 66 stays low. On the other hand, if signal E=Low, the operation result from the NOR gate 65 goes high. Accordingly, the operation result from the NOR gate 66 stays low.

As described above, the EEPROM according to the third embodiment of the present invention achieves effect (3) below in addition to effect (1) explained in the first embodiment and effect (2) explained in the second embodiment.

(3) The operation reliability of the EEPROM can improve (No. 3).

In the EEPROM according to this embodiment, the charge pump circuit 25 has the controller 60 that controls the control signal generator 40. This makes it possible to prevent the generation of a peak current in the charge pump circuit 25, thereby improving the operation reliability of the EEPROM. This effect will be explained below.

Figure 13:
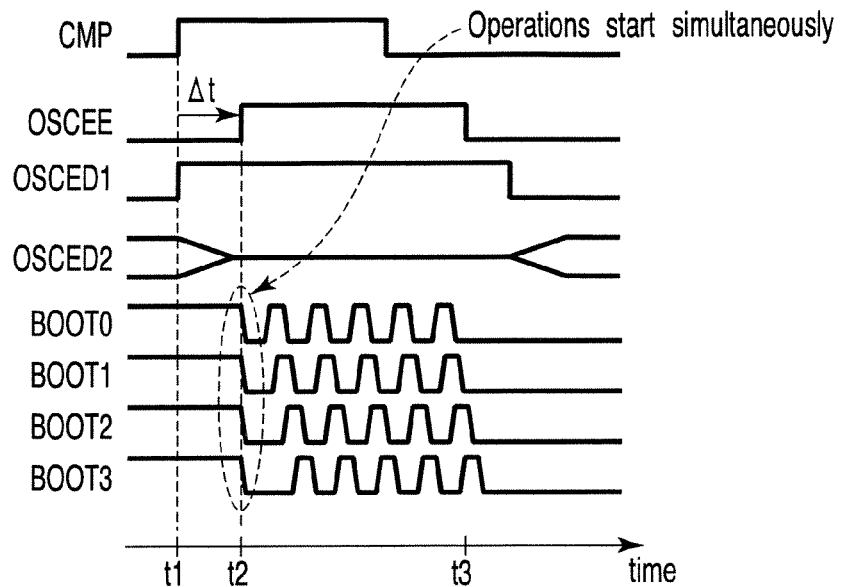
FIG. 13 is a timing chart of various signals in a charge pump circuit.

FIG. 13 is a timing chart of various signals in an arrangement corresponding to the second embodiment. Referring to FIG. 13, signals BOOT0 to BOOT3 respectively indicate the signals BOOT generated by the charge pump circuits 25-0 to 25-3. As shown in FIG. 13, in the arrangement of FIG. 8 explained in the second embodiment, if the charge pump circuits 25-0 to 25-3 are disabled with the BOOT signal holding units 50 of all the charge pump circuits 25-0 to 25-3 being held high, all the signals BOOT0 to BOOT3 go low when the charge pump circuits 25-0 to 25-3 are enabled the next time. As a consequence, the booster 30 generates a peak current.

Figure 14:
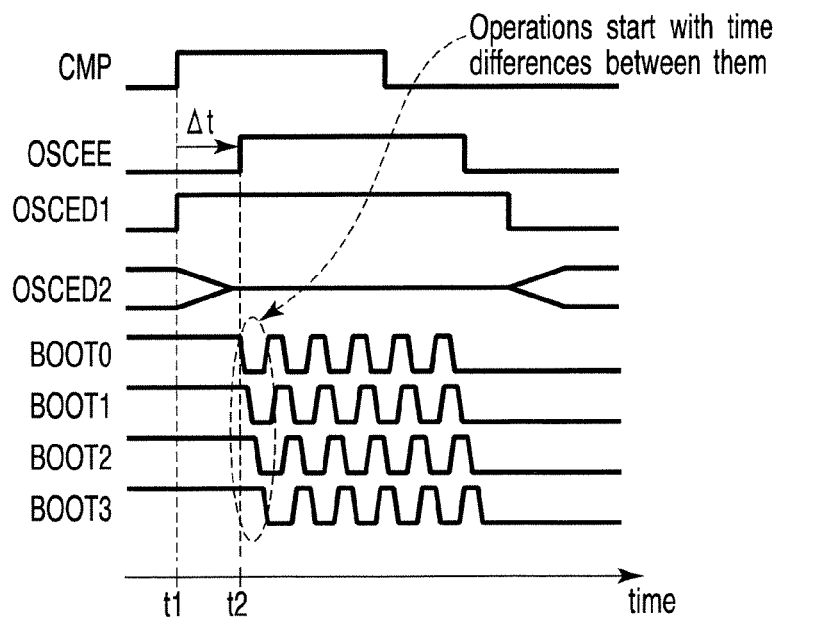
FIG. 14 is a timing chart of various signals in the charge pump circuit according to the third embodiment of the present invention.

In contrast, this embodiment can suppress the generation of the peak current described above. This will be explained with reference to FIGS. 12 and 14. FIG. 14 is a timing chart of various signals in the voltage generator 17 according to this embodiment. Similar to FIG. 9, the signals BOOT0 to BOOT3 respectively indicate the signals BOOT generated by the charge pump circuits 25-0 to 25-3.

In the arrangement according to this embodiment, when the signal E is low (when the control signal generator 40 is disabled), the signal E is not asserted unless the signals BOOT and RING match. That is, when the signals BOOT0 to BOOT3 are high, the control signal generators 40 of the charge pump circuits 25-0 to 25-3 are enabled at the timing when signals RING0 to RING3 go high.

As described previously, the signals RING0 to RING3 have phases shifted from one another so as to produce time differences between them. As shown in FIG. 14, therefore, the signals BOOT0 to BOOT3 go low in the order of BOOT0 to BOOT3 with time differences between them. Accordingly, it is possible to suppress the generation of the peak current in the booster 30.

In the semiconductor memory devices according to the first to third embodiments of the present invention as described above, the charge pump circuit 25 is enabled on the basis of a plurality of control signals (OSCED2 and CMP). To avoid the unstable period of one control signal (OSCED2), the other control signal (CMP) is delayed, and the charge pump circuit is controlled by using this delayed signal (OSCEE). This makes it possible to prevent the charge pump circuit 25 from generating a peak current, and improve the operation reliability of the semiconductor memory device. This effect is significantly obtained in a semiconductor memory that performs a dual operation.

Also, in the arrangement according to the second embodiment, the signal BOOT is held at the timing when the booster 30 in the charge pump circuit 25 is disabled. Therefore, it is possible to prevent a plurality of signals BOOT from simultaneously toggling when disabled. Furthermore, the third embodiment prevents a plurality of signals BOOT from simultaneously toggling when enabled.

Figure 15:
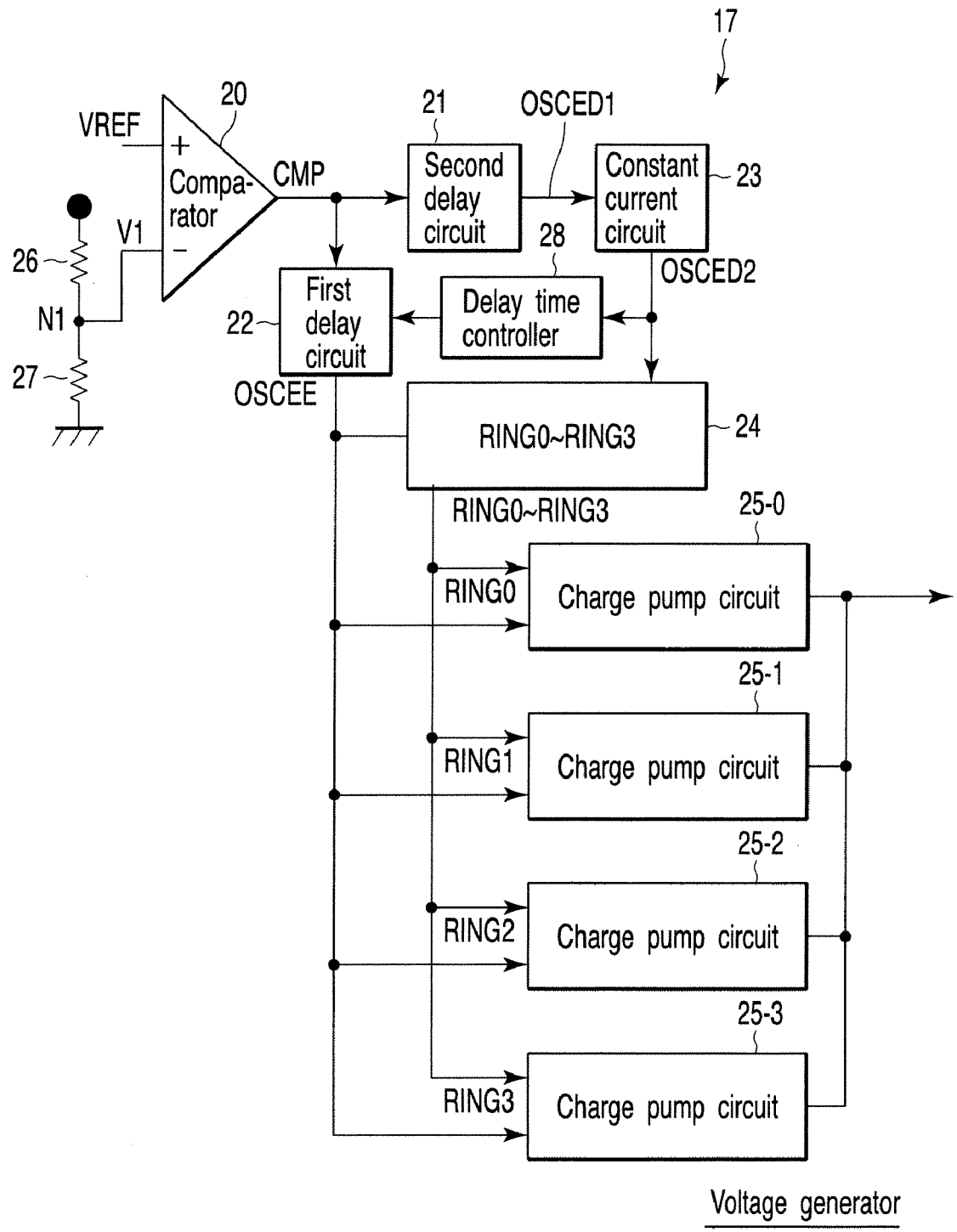
FIG. 15 is a block diagram of a voltage generator of an EEPROM according to a modification to the first to third embodiments of the present invention.

Note that the delay time described above may also be appropriately changed. FIG. 15 is a circuit diagram of a voltage generator 17 according to a modification to the first to third embodiments. As shown in FIG. 15, the voltage generator 17 further includes a delay time controller 28 in any of the arrangements explained in the first to third embodiments. The delay time controller 28 monitors an electric current at the output node of a constant current circuit 23. In accordance with the monitoring result, the delay time controller 28 controls the delay time of a first delay circuit 22. This is so because the length of delay of a signal CMP need only be the unstable period of a voltage OSCED2 in, e.g., FIG. 5.

The first delay circuit 22 may also be omitted from the second and third embodiments if the unstable state of the voltage OSCED2 in the constant current circuit 23 is not particularly a problem. FIG. 16 is a block diagram showing the arrangement of a voltage generator 17 from which the first delay circuit 22 is omitted. Although FIG. 16 shows the case that a charge pump circuit 25 has a controller 60, this modification is similarly applicable to the arrangement having no controller 60 according to the second embodiment.

In the arrangement shown in FIG. 16, a signal CMP is directly input to the charge pump circuit instead of a signal OSCEE. Signals CMP and RING control the controller 60, a voltage generator 40, and a BOOT signal holding unit 50. Accordingly, the BOOT signal holding unit 50 holds a signal BOOT at the timing when not the signal OSCEE but the signal CMP goes low.

Also, the above embodiments have been explained by taking NOR flash memories as examples, but the present invention is applicable to other semiconductor memories such as a NAND flash memory, i.e., extensively applicable to any semiconductor memories including a boosting circuit. Furthermore, as explained in the first embodiment, the present invention can be applied not only to a positive charge pump circuit but also to a charge pump circuit that generates a negative voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
 a memory cell array in which a plurality of memory cells each having a charge storage layer and a control gate formed on an inter-gate insulating film on the charge storage layer are arranged in a matrix;
 word lines each of which connects the control gates of the memory cells on the same row together in the memory cell array;

a row decoder which selects a word line, and applies a voltage to the selected word line; and a voltage generator which generates a boosted voltage, and outputs the boosted voltage as the voltage, the voltage generator including:

a comparator which compares a first voltage with a second voltage, and outputs a comparison result signal;

a constant current circuit which generates a first control signal in accordance with the comparison result signal output from the comparator;

a first delay circuit which generates a second control signal by delaying the comparison result signal output from the comparator; and a charge pump circuit which generates the boosted voltage in response to the first control signal and the second control signal.

2. The device according to claim 1, wherein a delay time of the comparison result signal in the first delay circuit is variable.

3. The device according to claim 1, wherein the voltage generator further includes a delay time controller which controls a delay time of the comparison result signal in the first delay circuit.

4. The device according to claim 1, wherein the charge pump circuit comprises:

a control signal generator which generates a third control signal by using the first control signal and the second control signal; and a booster which generates the boosted voltage in response to the third control signal.

5. The device according to claim 4, wherein the booster comprises:

a plurality of first transistors which function as series-connected diodes; and a plurality of second transistors which function as capacitor elements.

6. The device according to claim 1, wherein the charge pump circuit is enabled with a delay equal to a delay time of the second control signal from the comparison result signal.

7. The device according to claim 1, wherein the voltage generator further includes a second delay circuit which generates a third control signal by delaying the comparison result signal output from the comparator.

8. The device according to claim 1, wherein the semiconductor memory device comprises an EEPROM.

9. A semiconductor memory device comprising:

a memory cell array in which a plurality of memory cells each having a charge storage layer and a control gate formed on an inter-gate insulating film on the charge storage layer are arranged in a matrix;

word lines each of which connects the control gates of the memory cells on the same row together in the memory cell array;

a row decoder which selects a word line, and applies a voltage to the selected word line; and a voltage generator which generates a boosted voltage, and outputs the boosted voltage as the voltage, the voltage generator including:

a comparator which compares a first voltage with a second voltage, and outputs a comparison result signal;

a constant current circuit which generates a first control signal in accordance with the comparison result signal output from the comparator; and a charge pump circuit having a control signal generator, a booster, and a holding unit, the control signal generator generating a second control signal by using the comparison result signal and the first control signal, the booster generating the boosted voltage in response to the second control signal, and the holding unit holding the second control signal when the comparison result signal is disabled, and controlling the booster by the held second control signal.

10. The device according to claim 9, wherein the voltage generator further includes a first delay circuit which generates a third control signal by delaying the comparison result signal output from the comparator.

11. The device according to claim 10, wherein the voltage generator further includes a second delay circuit which generates a fourth control signal by delaying the comparison result signal output from the comparator.

12. The device according to claim 10, wherein when the third control signal is disabled, the control signal generator is disabled, and the holding unit keeps holding the second control signal at that time.

13. The device according to claim 10, wherein the charge pump circuit is enabled with a delay equal to a delay time of the third control signal from the comparison result signal.

14. The device according to claim 10, wherein the voltage generator further includes a delay time controller which controls a delay time of the comparison result signal in the first delay circuit.

15. A semiconductor memory device comprising:

a memory cell array in which a plurality of memory cells each having a charge storage layer and a control gate formed on an inter-gate insulating film on the charge storage layer are arranged in a matrix;

word lines each of which connects the control gates of the memory cells on the same row together in the memory cell array;

a row decoder which selects a word line, and applies a voltage to the selected word line; and a voltage generator which generates a boosted voltage, and outputs the boosted voltage as the voltage, the voltage generator including:

a comparator which compares a first voltage with a second voltage, and outputs a comparison result signal;

a constant current circuit which generates a first control signal in accordance with the comparison result signal output from the comparator; and a plurality of charge pump circuits each of which generates the boosted voltage in response to the comparison result signal and the first control signal, and each of the charge pump circuits including:

a control signal generator which generates a second control signal by using the comparison result signal and the first control signal;

a booster which generates the boosted voltage in response to the second control signal;

a holding unit which holds the second control signal when the comparison result signal is disabled, and controls the booster by the held second control signal; and a controller which operates the control signal generator to produce time differences between the charge pump circuits when the comparison result signal is enabled.

16. The device according to claim 15, wherein the voltage generator further includes a delay circuit which generates a third control signal by delaying the comparison result signal output from the comparator.

17. The device according to claim 16, wherein the charge pump circuit is enabled with a delay equal to a delay time of the third control signal from the comparison result signal.

18. The device according to claim 16, wherein when the third control signal is disabled, the control signal generator is disabled, and the holding unit keeps holding the second control signal at that time.

19. The device according to claim 16, wherein the voltage generator further includes a delay time controller which controls a delay time of the comparison result signal in the delay circuit.

20. The device according to claim 15, wherein the second control signals of the charge pump circuits have phases shifted from one another to produce time differences therebetween.

* * * * *